United States Patent
Suzuki

(10) Patent No.: US 7,217,983 B2
(45) Date of Patent: May 15, 2007

(54) PHOTOELECTRIC CONVERSION FILM-STACKED TYPE SOLID-STATE IMAGING DEVICE

(75) Inventor: Nobuo Suzuki, Miyagi (JP)

(73) Assignee: Fujifilm Corporation, Minami-Ashigara-shi, Kanagawa (JP)

( * ) Notice: Subject to any disclaimer, the term of this patent is extended or adjusted under 35 U.S.C. 154(b) by 22 days.

(21) Appl. No.: 11/081,773

(22) Filed: Mar. 17, 2005

(65) Prior Publication Data

US 2005/0205901 A1    Sep. 22, 2005

(30) Foreign Application Priority Data

Mar. 18, 2004    (JP)    ............................ P.2004-077756

(51) Int. Cl.
    *H01L 31/00*    (2006.01)
(52) U.S. Cl. ...................... 257/444; 257/226; 257/239; 257/291; 257/292; 257/E27.135
(58) Field of Classification Search ................ 257/291, 257/292, 440, 444, 223, 229, E31.111, E27.133, 257/E27.134, E27.135, E27.142, 294, 226, 257/239, E27.132; 348/272, 276, 277, 281, 348/308, 300; 358/44, 213.31
See application file for complete search history.

(56) References Cited

U.S. PATENT DOCUMENTS

| | | | | |
|---|---|---|---|---|
| 4,438,455 A | * | 3/1984 | Tabei | 348/280 |
| 4,912,560 A | * | 3/1990 | Osawa et al. | 348/313 |
| 5,311,319 A | * | 5/1994 | Monoi | 348/300 |
| 6,239,453 B1 | | 5/2001 | Yamada et al. | |
| 6,300,612 B1 | | 10/2001 | Yu | |
| 6,730,934 B2 | | 5/2004 | Yamada et al. | |
| 6,998,660 B2 | * | 2/2006 | Lyon et al. | 257/294 |
| 2002/0003201 A1 | | 1/2002 | Yu | |
| 2002/0101895 A1 | | 8/2002 | Augusto | |
| 2004/0056180 A1 | | 3/2004 | Yu | |

FOREIGN PATENT DOCUMENTS

| | | |
|---|---|---|
| JP | 58-103165 | 6/1983 |
| JP | A-2002-502120 | 1/2002 |
| JP | 2002-83946 A | 3/2002 |
| JP | 2003-502847 | 1/2003 |
| JP | B2-3405099 | 3/2003 |

* cited by examiner

*Primary Examiner*—Minhloan Tran
*Assistant Examiner*—Benjamin Tzu-Hung Liu
(74) *Attorney, Agent, or Firm*—Birch, Stewart, Kolasch & Birch, LLP

(57) ABSTRACT

To provide a solid-state imaging device in which the number of transistors for each signal readout circuit provided in a semiconductor substrate side is reduced and the number of image signal readout lines is reduced, solid-state imaging device a semiconductor substrate; a stacked photoelectric conversion films detecting different colors contained in an incident light; and pixel electrode films partitioned in accordance with pixels, wherein the semiconductor substrate includes: a plurality of color selection transistors corresponding to one of the pixels, wherein the color selection transistors each corresponds to one of the photoelectric conversion films and connects to one of the pixel electrode films on the one of the photoelectric conversion films so as to be capable of selecting the one of the photoelectric conversion films; and a charge detection cell corresponding to one of the pixels, the charge detection cell being common to the photoelectric conversion films.

13 Claims, 8 Drawing Sheets

PHOTOELECTRIC CONVERSION FILM-STACKED TYPE SOLID-STATE IMAGING DEVICE

FIELD OF THE INVENTION

The present invention relates to a photoelectric conversion film-stacked type solid-state imaging device in which photoelectric conversion films for generating charges in accordance with the intensity of received light are stacked on a semiconductor substrate, and particularly relates to a photoelectric conversion film-stacked type solid-state imaging device in which signals in accordance with the amounts of signal charges generated by photoelectric conversion films are read out to the outside by MOS type transistor circuits formed on a semiconductor substrate.

BACKGROUND OF THE INVENTION

In a CCD type solid-state imaging device or a CMOS type solid-state imaging device mounted in a digital camera, a large number of photoelectric conversion devices (photodiodes) serving as photo acceptance portions and signal readout circuits for reading out photoelectric conversion signals obtained by the photoelectric conversion devices to the outside are formed on a surface of a semiconductor substrate. In the CCD type solid-state imaging device, each of the signal readout circuits includes a charge transfer circuit, and a transfer electrode. In the CMOS type solid-state imaging device, each of the signal readout circuits includes an MOS circuit, and a signal wiring.

Accordingly, in the solid-state imaging device according to the related art, both the large number of photo acceptance portions and the signal readout circuits have to be formed together on the surface of the semiconductor substrate. There is a problem that the total area of the photo acceptance portions cannot be enlarged.

In addition, in a single plate type solid-state imaging device according to the related art, one of color filters, for example, of red (R), green (G) and blue (B) is stacked on each photo acceptance portion so that each photo acceptance portion can detect an optical signal with corresponding one of the colors. For this reason, for example, a blue optical signal and a green optical signal in a position of a photo acceptance portion for detecting red light are obtained by applying an interpolation operation on detection signals of surrounding photo acceptance portions for detecting blue light and green light. This causes false colors to thereby result in lowering of resolution. In addition, blue and green light beams incident on a photo acceptance portion covered with a red color filter are absorbed as heat to the color filter without giving any contribution to photoelectric conversion. For this reason, there is also another problem that light utilization efficiency deteriorates and sensitivity is lowered.

While the solid-state imaging device according to the related art has various problems as described above, development on increase in the number of pixels has advanced. At present, a large number of photo acceptance portions (e.g. equivalent to several million pixels) are integrated on one chip of a semiconductor substrate, so that the size of an aperture of each photo acceptance portion approaches the wavelength of light. Accordingly, it is difficult to expect a CCD type or CMOS type image sensor to have better image quality or sensitivity than ever to thereby solve the above-mentioned problems.

Under such circumstances, the structure of a solid-state imaging device, for example, described in JP-A-58-103165 has been reviewed. The solid-state imaging device has a structure in which a photosensitive layer for detecting red light, a photosensitive layer for detecting green light and a photosensitive layer for detecting blue light are stacked on a semiconductor substrate having signal readout circuits formed in its surface, by a film-forming technique and in which these photosensitive layers are provided as photo acceptance portions so that photoelectric conversion signals obtained by the photosensitive layers can be taken out to the outside by the signal readout circuits. That is, the solid-state imaging device has a photoelectric conversion film-stacked type structure.

According to the structure, limitation on design of the signal readout circuits can be reduced greatly because it is unnecessary to provide any photo acceptance portion on the surface of the semiconductor substrate. Moreover, sensitivity can be improved because efficiency in utilization of incident light is improved. In addition, resolution can be improved because light with the three primary colors of red, green and blue can be detected from one pixel (one photo acceptance portion). The problem of false colors can be eliminated. The problems inherent to the CCD type or CMOS type solid-state imaging device according to the related art can be solved.

Therefore, photoelectric conversion film-stacked type solid-state imaging devices described in JP-A-2002-83946, JP-T-2002-502120, JP-T-2003-502841 and JP-B-3405099 have been proposed in recent years. An organic semiconductor or nano particles may be used as the material of each photosensitive layer.

In the solid-state imaging device in which the photoelectric conversion films are stacked on the semiconductor substrate, signals of the three colors of red (R), green (G) and blue (B) can be detected simultaneously from the same pixel (the same photo acceptance portion) because the photoelectric conversion films are stacked as three layers, that is, a photoelectric conversion film for detecting red (R), a photoelectric conversion film for detecting green (G), and a photoelectric conversion film for detecting blue (B) are stacked.

FIG. 11 is a circuit configuration diagram of a signal readout circuit provided in a CMOS type image sensor according to the related art. In FIG. 11, a charge readout transistor 14 is connected to a photodiode 10 for detecting a photoelectric conversion signal of one color, an output transistor 11 and a reset transistor 13 are connected to the charge readout transistor 14, and a row selection transistor 12 is connected to the output transistor 11. That is, four MOS transistors are used. Incidentally, the reference numeral 20 designates a column signal line (image signal line); 21 designates a row selection signal line; 22 designates a reset signal line; 23 designates a DC power supply line; and 24 designates a charge readout signal line.

In the photoelectric conversion film-stacked type solid-state imaging device of the type in which the three colors are detected from one pixel, three colors each pixel can be detected simultaneously. Accordingly, when three signal readout circuits each the same as that shown in FIG. 11, that is, twelve MOS transistors in total are provided, signals of three colors can be read out simultaneously and in parallel.

In the photoelectric conversion film-stacked type solid-state imaging device, because it is unnecessary to provide any photo acceptance portion (photodiode shown in FIG. 11) in the semiconductor substrate, there is room for forming a large number of transistors in the semiconductor substrate. In order to make each pixel finer in the photoelectric conversion film-stacked type solid-type image sensing device, it is, however, preferable that the number of transistors in each signal readout circuit is as small as possible though there is still room in the semiconductor substrate.

In the case of a solid-state imaging device in which analog image signals read out by the signal readout circuits are converted into digital signals before image signals are output to the outside, it is necessary to provide an analog-to-digital conversion portion in an image signal output portion. In order to output image signals of three colors as digital signals simultaneously and in parallel, it is necessary to make the circuit configuration of the analog-to-digital conversion portion fine and manufacture three analog-to-digital conversion portions. Thus, there is a problem that cost will increase.

In recent years, there has been an increasing demand for a solid-state imaging device of the type in which a signal of another color, for example, an intermediate color (e.g. emerald color) between green (G) and blue (B) besides red (R), green (G) and blue (B) can be detected. In this case, it can be achieved when a photoelectric conversion film for detecting the emerald color is provided additionally. The required number of transistors in a signal readout circuit provided in the semiconductor substrate side is sixteen per pixel in total, so that four analog-to-digital conversion portions are required. For this reason, manufacturing cost increases. Moreover, a pitch between wirings for the image signal output portion to accept a signal from each pixel becomes narrow to thereby cause another problem that manufacturing becomes difficult.

SUMMARY OF THE INVENTION

An object of the invention is to provide a photoelectric conversion film-stacked type solid-state imaging device in which the number of transistors in each signal readout circuit provided in a semiconductor substrate side can be reduced so that manufacturing cost can be reduced.

According to the invention, there is provided a solid-state imaging device including: a semiconductor substrate; a plurality of photoelectric conversion films stacked in a direction perpendicular to a surface of the semiconductor substrate, the photoelectric conversion films detecting different colors contained in an incident light; and a plurality of pixel electrode films on each of the photoelectric conversion films, the pixel electrode films being partitioned in accordance with pixels. The semiconductor substrate includes: a plurality of color selection transistors corresponding to one of the pixels, wherein the color selection transistors each corresponds to one of the photoelectric conversion films and connects to one of the pixel electrode films on the one of the photoelectric conversion films so as to be capable of selecting the one of the photoelectric conversion films; and a charge detection cell corresponding to one of the pixels, wherein the charge detection cell is common to the photoelectric conversion films, and the charge detection cell reads out a signal to an image signal readout line in accordance with a signal charge generated in each of the photoelectric conversion films.

According to this configuration, the number of color selection transistors increases but the sum of the number of transistors constituting the charge detection cell and the number of color selection transistors can be reduced because the charge detection cell can be shared among the color selection transistors. Accordingly, manufacturing cost and the number of image signal readout lines can be reduced.

In the solid-state imaging device according to the invention, the semiconductor substrate includes a charge drain transistor corresponding to one of the color selection transistors, and the charge drain transistor drains the signal charge to a power supply line, wherein the signal charge is generated by one of the photoelectric conversion films, the one of the photoelectric conversion films has one of the pixel electrode films thereon, and the one of the pixel electrode films connects to the one of the color selection transistors.

According to this configuration, the number of charge drain transistors increases but phenomena of color mixture and lowering of the saturated output can be avoided.

In the solid-state imaging device according to the invention, the semiconductor substrate includes: a connection portion that connects one of the pixel electrode films to the surface of the semiconductor substrate by a wiring; a potential barrier unit near to the connection portion; and a charge-storage unit near to the potential barrier unit, the charge-storage unit connecting to one of the color selection transistors.

According to this configuration, the signal charge can be transferred to and accumulated in the charge-storage unit rapidly, so that the signal charge can be read out rapidly.

In the solid-state imaging device according to the invention, the semiconductor substrate includes: a first semiconductor layer having a conductivity type (a first conductivity type) opposite to that of a semiconductor region of the connection portion; a second semiconductor layer having a conductivity type (a second conductivity type) common to that of the semiconductor region of the connection portion; and a third semiconductor layer having the conductivity type opposite to that of the semiconductor region of the connection portion in this order, and the potential barrier unit and the charge-storage unit comprise the first, second and third semiconductor layers. Moreover, thicknesses and impurity densities of the first, second and third semiconductor layers (i.e. a first thickness and a first impurity density of the first semiconductor layer, a second thickness and a second impurity density of the second semiconductor layer, and a third thickness and a third impurity density of the third semiconductor layer) are selected so that the potential barrier unit serves as a potential barrier and the charge-storage unit accumulates the signal charge.

According to this configuration, it is easy to control manufacturing of the potential barrier units and the charges storage units.

In the solid-state imaging device according to the invention, a fourth semiconductor layer formed in the inside of the third semiconductor layer and on a lower side of the charge storage unit and having a conductivity type common to that of the semiconductor portion of the connection portion is provided as a charge overflow drain.

According to this configuration, phenomena of color mixture and lowering in saturated output can be avoided because an excessive charge can be drained immediately even in the case where the excessive charge flow into the charge-storage unit.

In the solid-state imaging device according to the invention, thicknesses and impurity densities of the third and fourth semiconductor layers (i.e. a third thickness and a third impurity density of the third semiconductor layer, and a fourth thickness and a fourth impurity density of the fourth semiconductor layer) are selected suitably so that the excessive charge in the charge-storage unit are drained to the charge overflow drain.

According to this configuration, it is easy to control manufacturing of the charge overflow drain.

In the solid-state imaging device according to the invention, the pixels are arranged in a tetragonal lattice, and color selection transistors in accordance with the pixels horizontally arranged connect to a selection signal line so that the pixels horizontally arranged simultaneously read out signals having common color.

According to this configuration, it is easy to process the signal of respective colors read out from the solid-state imaging device.

In the solid-state imaging device according to the invention, the pixels are arranged in a tetragonal lattice, and color selection transistors in accordance with the pixels horizontally arranged connect to a selection signal line so that adjacent two of the pixels horizontally arranged simultaneously read out signals having different colors.

According to this configuration, it is easy to generate motion picture data with low resolution but high quality at a high frame rate when data read out from the respective pixels is thinned.

In the solid-state imaging device according to the invention, the photoelectric conversion films include: a first photoelectric conversion film having a peak of spectral sensitivity characteristic at red; a second photoelectric conversion film having a peak of spectral sensitivity characteristic at green; and a third photoelectric conversion film having a peak of spectral sensitivity characteristic at blue.

According to this configuration, it is possible to capture a color image based on the three primary colors and it is possible to use an existing signal processing circuit for R, G and B signals.

In the solid-state imaging device according to the invention, the semiconductor substrate includes an image signal output portion that accepts a analog signal and outputs the analog signal, the analog signal being read out from the charge detection cell to the image signal readout line. Moreover, the image signal output portion comprises an analog-to-digital conversion portion that converts the analog signal to a digital signal and outputs the digital signals.

The invention can be applied to a solid-state imaging device for outputting the image signal as the analog signal or to a solid-state imaging device for outputting the image signal as the digital signal.

In the solid-state imaging device according to the invention, the charge detection cell has a three-transistor configuration including: an output transistor that outputs the signal to the image signal readout line in accordance with the signal charge; a selection transistor that switches (or chooses) between an operation and non-operation of the output transistor; and a reset transistor that drains the signal charge retaining in the output transistor.

According to this configuration, the configuration of the signal readout circuit used heretofore can be used directly.

According to the invention, it is possible to provide a photoelectric conversion film lamination type solid-state imaging device in which the number of transistors in each signal readout circuit provided on the semiconductor substrate side can be reduced so that manufacturing cost can be reduced.

DETAILED DESCRIPTION OF THE INVENTION

An embodiment of the invention will be described below with reference to the drawings.

First Embodiment

Figure 1:
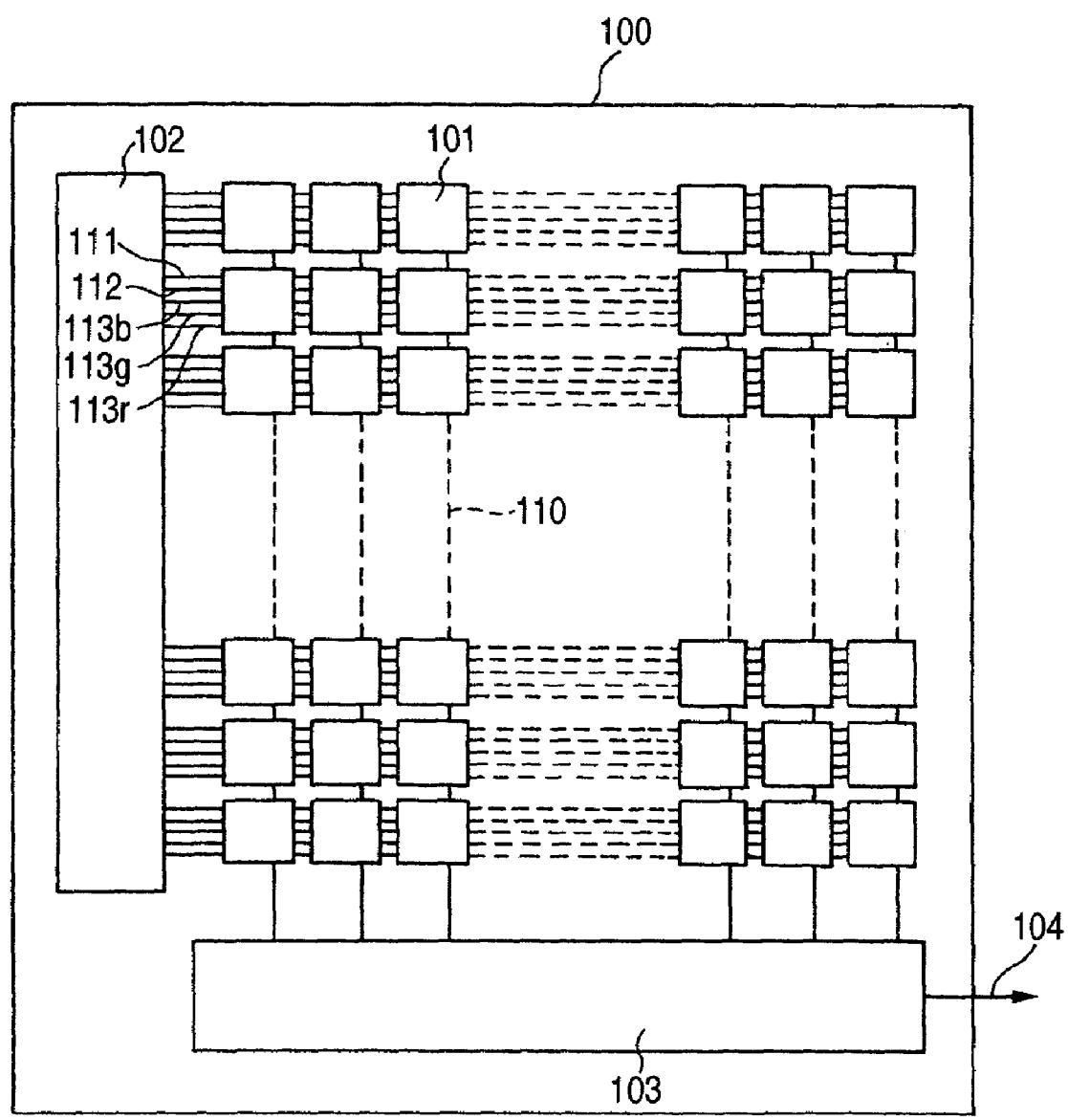
FIG. 1 is a typical view showing a surface of a solid-state imaging device according to a first embodiment of the invention.

FIG. 1 is a typical view showing a surface of a solid-state imaging device according to a first embodiment of the invention. The solid-state imaging device 100 includes a large number of photo acceptance portions 101 (each corresponding to a pixel). In this embodiment, the photo acceptance portions 101 are arranged in the form of a tetragonal lattice. Signal readout circuits constituted by an MOS transistor circuit, which will be described later, are formed on a surface portion of a semiconductor substrate under each of the photo acceptance portions 101 of the solid-state imaging device 100.

Color selection signals through color selection signal lines 113r, 113g and 113b as well as a row selection signal through a row selection signal line 111 and a reset signal through a reset signal line 112 are given from a row selection scanning circuit 102 to each of the signal readout circuits provided in accordance with the photo acceptance portions. Column signal (i.e. image signal) through column signal line (i.e. image signal line) 110 is output from the signal readout circuits to an image signal output portion 103. An output signal 104 is output from the image signal output portion 103. The image signal output portion 103 may output the taken-in image signals as analog signals, or may have an analog-to-digital conversion that converts the image signals into digital signals and may output the digital signals.

In this embodiment, each of the signal readout circuits outputs an image signal of a color selected in accordance with a color selection signal 113r, 113g or 113b, as an image signal 110 to the image signal output portion 103. Incidentally, a suffix r, g or b corresponds to red (R), green (G) or blue (B) which is the color of incident light to be detected. The same rule applies to the following description.

Figure 2:
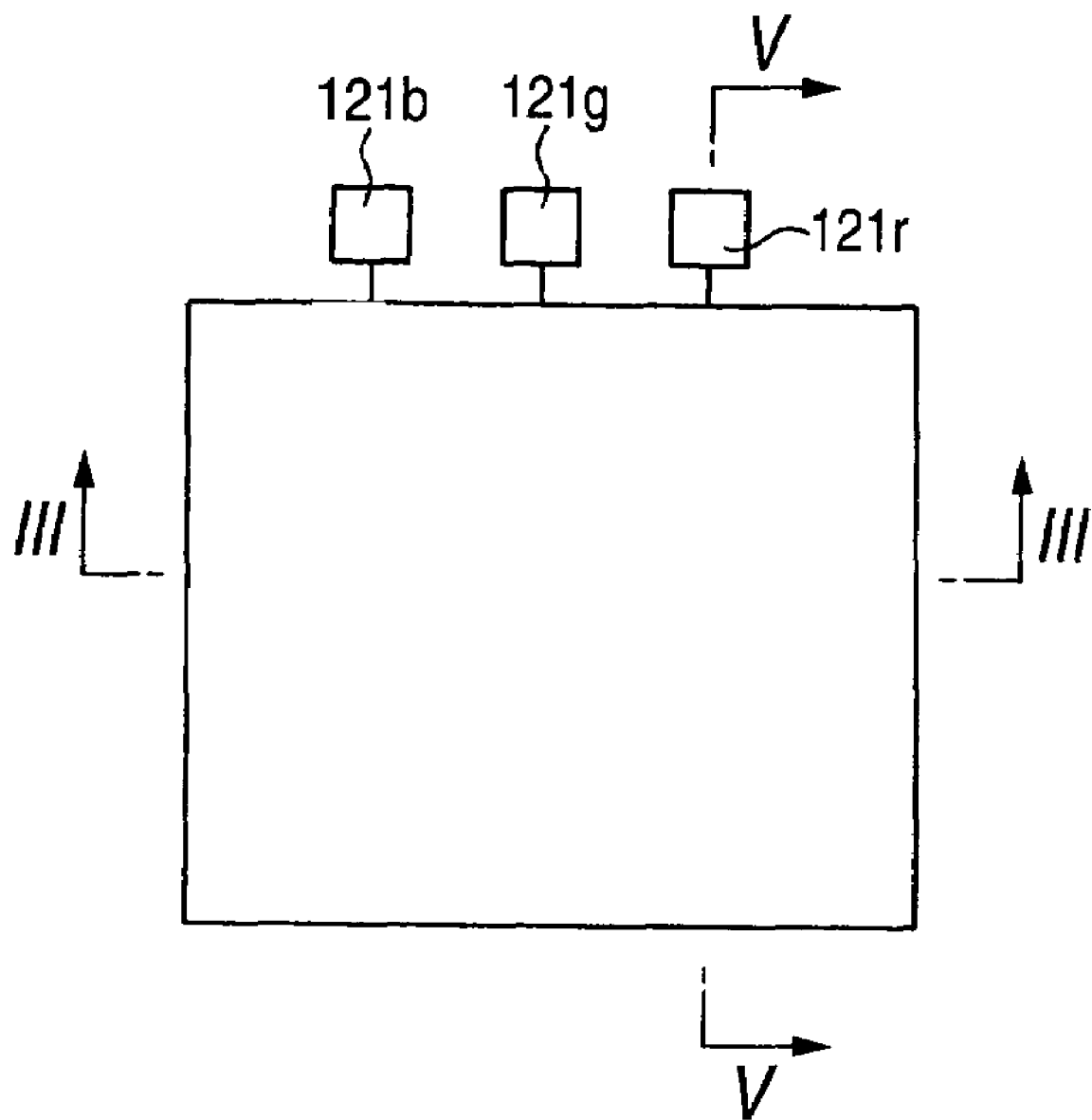
FIG. 2 is an enlarged typical view showing each photo acceptance portion depicted in FIG. 1.

FIG. 2 is an enlarged typical view showing each photo acceptance portion 101 depicted in FIG. 1. In this embodiment, three connection portions 121r, 121g and 121b each photo acceptance portion 101 are provided in one photo acceptance portion 101.

Figure 3:
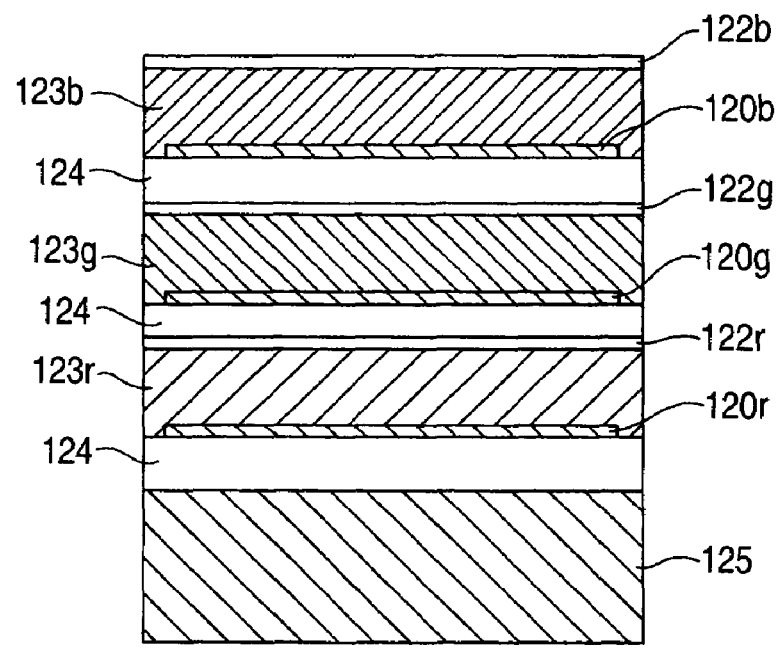
FIG. 3 is a typical sectional view taken along the line III—III in FIG. 2.

FIG. 3 is a typical sectional view taken along the line III—III in FIG. 2. A transparent insulator film 124 is first stacked on a semiconductor substrate 125. An electrode film (hereinafter referred to as pixel electrode film) 120r partitioned in accordance with the photo acceptance portions 101 is then stacked on the transparent insulator film 124. A photoelectric conversion film 123r for detecting red (R) is then stacked on the electrode film 120r. The photoelectric conversion film 123r need not be partitioned in accordance with the photo acceptance portions. That is, the photoelectric conversion film 123r is stacked as a single sheet on the whole of a photo acceptance surface formed by a set of all the photo acceptance portions 101.

A common electrode film 122r which is common to the respective photo acceptance portions 101 for detecting red signals is stacked likewise as a single sheet on the photoelectric conversion film 123r. A transparent insulator film 124 is then stacked on the common electrode film 122r.

A pixel electrode film 120g partitioned in accordance with the photo acceptance portions 101 is stacked on the insulator film 124. A photoelectric conversion film 123g for detecting green (G) is stacked as a single sheet on the pixel electrode film 120g in the same manner as described above. A common electrode film 122g is then stacked on the photoelectric conversion film 123g. A transparent insulator film 124 is then stacked on the common electrode film 122g.

A pixel electrode film 120b partitioned into in accordance with the photo acceptance portions 101 is stacked on the insulator film 124. A photoelectric conversion film 123b for detecting blue (B) is stacked as a single sheet on the pixel electrode film 120b in the same manner as described above. A common electrode film 122b is then stacked on the photoelectric conversion film 123b.

The pixel electrode films 120b, 120g and 120r in accordance with the respective photo acceptance portions are arranged in a line with respect to an incident direction of an incident light (i.e. approximately in a direction perpendicular to a surface of the semiconductor substrate). That is, the solid-state imaging device 100 according to the embodiment is configured so that the three colors of red (R), green (G) and blue (B) are detected by each photo acceptance portion 101. The simply described term "pixel" hereinafter means a photo acceptance portion 101 for detecting the three colors whereas the described term "color pixel", "red pixel", "green pixel" or "blue pixel" means a partial pixel (i.e. a portion of a photoelectric conversion film sandwiched between a common electrode film and a pixel electrode film) for detecting corresponding one of the colors.

The connection portion 121b shown in FIG. 2 is connected to a blue pixel electrode film 120b. The connection portion 121g shown in FIG. 2 is connected to a green pixel electrode film 120g. The connection portion 121r shown in FIG. 2 is connected to a red pixel electrode film 120r.

A tin oxide ($SnO_2$) thin film, a titanium oxide ($TiO_2$) thin film, an indium oxide ($InO_2$) thin film or an indium titanium oxide (ITO) thin film may be used as each of the homogeneous transparent electrode films 122r, 122g, 122b, 120r, 120g and 120b. The homogeneous transparent electrode film is not limited thereto.

A single layer film or a multilayer film may be used as each of the photoelectric conversion films 123r, 123g and 123b. Various materials can be used as the materials of the photoelectric conversion films 123r, 123g and 123b. Examples of the materials include: inorganic materials such as silicon or compound semiconductor; organic materials containing organic semiconductor, organic pigment, etc.; and quantum dot-deposited films made from nano particles.

Figure 4:
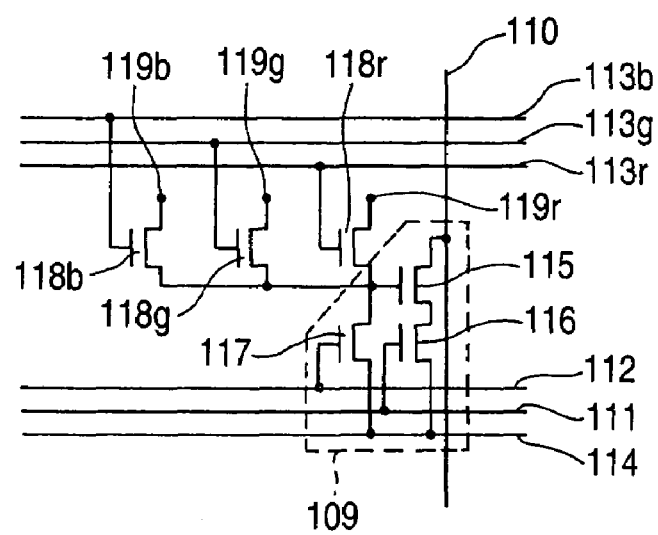
FIG. 4 is a circuit diagram of a signal readout circuit formed in the surface of a semiconductor substrate depicted in FIG. 3.
Figure 11:
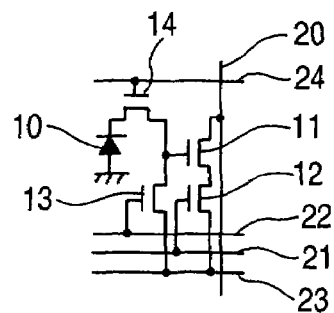
FIG. 11 is a circuit diagram of a signal readout circuit used in a CMOS type image sensor according to the related art.

FIG. 4 is a circuit configuration diagram of each signal readout circuit formed in the semiconductor substrate 125. The signal readout circuit has a charge detection cell 109 of the same configuration as that in FIG. 11. That is, the signal readout circuit has an output transistor 115 outputting the image signal to the column signal line (the image signal readout line) 110 in accordance with a signal charge, a selection transistor (i.e. a row selection transistor) 116 selecting (or switching or choosing) an operation/non-operation of the output transistor 115, and a reset transistor 117 draining the signal charge in the output transistor 115. A source of the output transistor 115 is connected to the column signal line 110. A gate of the output transistor 115 is connected to a source of the reset transistor 117. A drain of the output transistor 115 is connected to a source of the row selection transistor 116. Both drains of the row selection transistor 116 and the reset transistor 117 are connected to a DC power supply line 114. A gate of the row selection transistor 116 is connected to the row selection signal line 111. A gate of the reset transistor 117 is connected to the reset signal line 112.

In this embodiment, there is provided one charge detection cell 109 each photo acceptance portion 101, and there are provided three color selection transistors 118r, 118g and 118b each photo acceptance portion 101. All drains of the color selection transistors 118r, 118g and 118b are connected to the gate of the output transistor 115 in common. Gates of the color selection transistors 118r, 118g and 118b are connected to the color selection signal lines 113r, 113g and 113b respectively. That is, a color selection transistor 118r, 118g or 118b designated by any one of the color selection signal lines 113r, 113g and 113b is electrically conducted so that a source and drain of the color selection transistor are connected to each other.

The connection portion 121r of the red pixel electrode film 120r shown in FIG. 2 is connected by a columnar wiring electrode (a wiring) 144r (which will be described later) to a connection portion 119r connected to the source of the color selection transistor 118r. The connection portion 121g of the green pixel electrode film 120g shown in FIG. 2 is connected by a columnar wiring electrode (not shown) to a connection portion 119g connected to the source of the color selection transistor 118g. The connection portion 121b of the blue pixel electrode film 120b shown in FIG. 2 is connected by a columnar wiring electorde (not shown) to a connection portion 119b connected to the source of the color selection transistor 118b.

Figure 5:
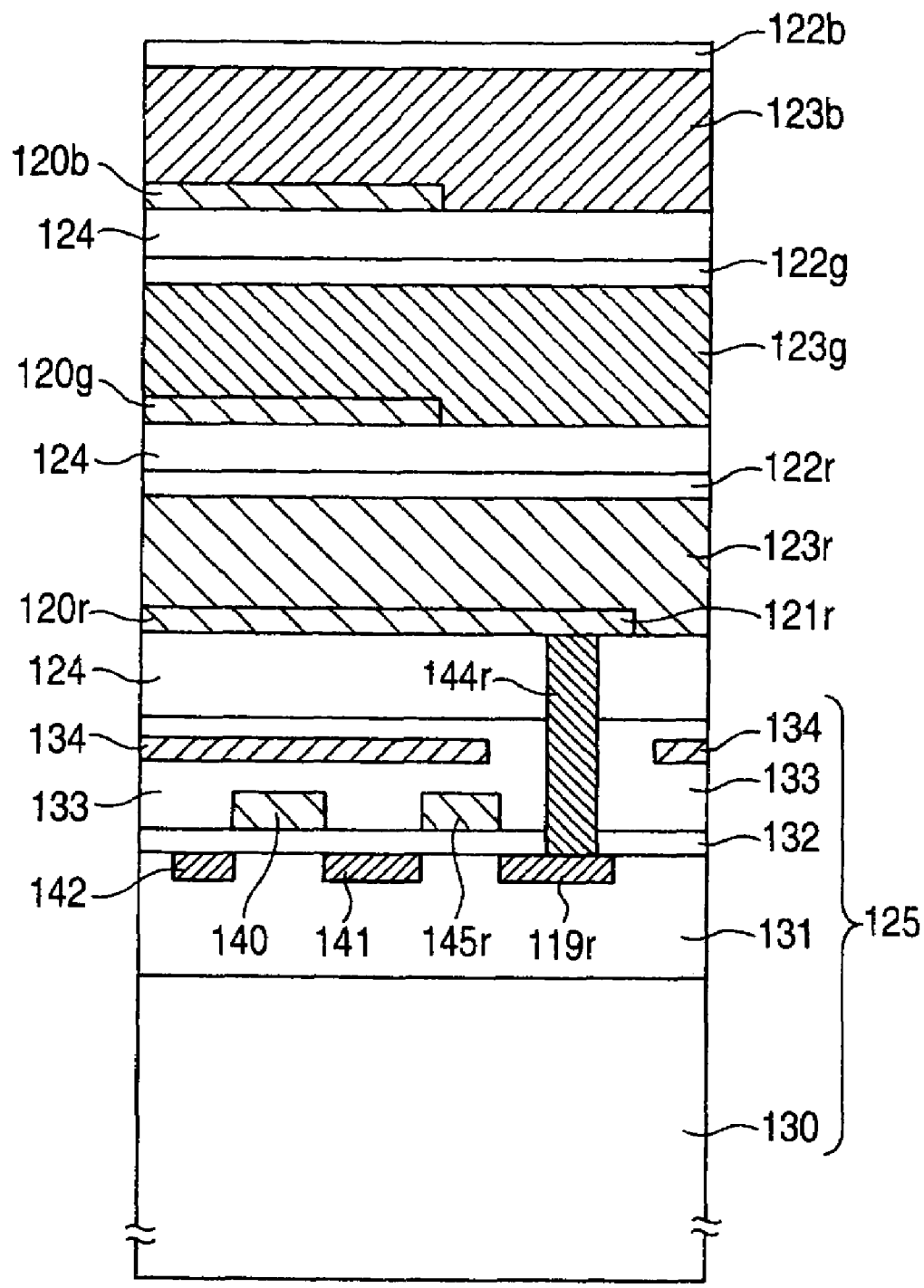
FIG. 5 is a typical sectional view taken along the line V—V in FIG. 2.

FIG. 5 is a typical sectional view taken along the line V—V in FIG. 2. That is, FIG. 5 is a view including a section of a portion stacked on the semiconductor substrate 125 shown in FIG. 3. AP-well layer 131 is formed on a surface portion of an n-type semiconductor substrate 130. In this embodiment, as shown in FIG. 5, a source 141 (made of an $n^+$ layer) of the reset transistor 117 described in FIG. 4 is formed in the surface of the P-well layer 131. The source 141 serves also as the drain of the color selection transistor 118r and is connected to the gate of the output transistor 115.

A drain 142 (made of an $n^+$ layer) of the reset transistor 117 and the connection portion 119r are further formed in the surface of the P-well layer 131. The connection portion 119r is made of an $n^+$ layer and serves also as the source of the color selection transistor 118r.

A gate insulator film 132 is formed on the surface of the P-well layer 131. A gate electrode 140 of the reset transistor 117 and a gate electrode 145r of the color selection transistor 118r are provided on the gate insulator film 132. A columnar wiring electorde 144r piercing the gate insulator film 132 so as to extend to the connection portion 121r of the red pixel electrode film 120r shown in FIG. 2 is formed on the connection portion 119r.

An insulator film 133 is stacked on the gate insulator film 132. A light shielding film 134 is buried in the insulator film 133. The lowest insulator film 124 shown in FIG. 3 is stacked on the insulator film 133. The semiconductor substrate 125 shown in FIG. 3 is equivalent to a region ranging from the n-type semiconductor substrate 130 to the insulator film 133 in FIG. 5.

The columnar wiring electrode 144r connected to the red pixel electrode film 120r is shown in FIG. 5 because FIG. 5 is a typical sectional view taken along the line V—V in FIG. 2. A columnar wiring electrode extending to the green pixel electrode film 120g and a columnar wiring electrode extending to the blue pixel electrode film 120b are provided so as to be erected on the rear side and the front side of the illustrated columnar wiring electrode 144r in a plane of FIG. 5. The structure around the red columnar wiring 144r can be applied to those around the other color columnar wiring electrodes.

Figure 6A:
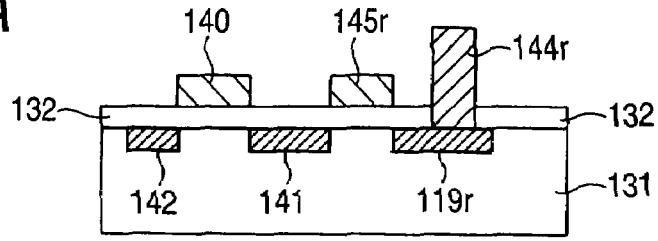
FIGS. 6A to 6D are views for explaining transfer of charges in the solid-state imaging device according to the first embodiment of the invention.
Figure 6B:
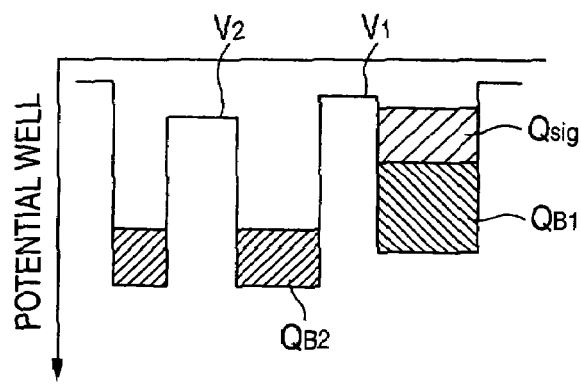

FIGS. 6A to 6D are views for explaining transfer of charges in the structure shown in FIG. 5. FIG. 6A is a view of the structure of main part extracted from FIG. 5. FIG. 6B is a view showing a state of a potential well just after resetting in the structure of FIG. 6A.

Signal charges Qsig output from the red pixel electrode film 120r in accordance with the intensity of red incident light are accumulated in the connection portion 119r. Incidentally, charges QB1 retaining under the signal charges Qsig are constant bias charges retaining in the source of the color selection transistor 118r serving also as the connection portion 119r.

Figure 6C:
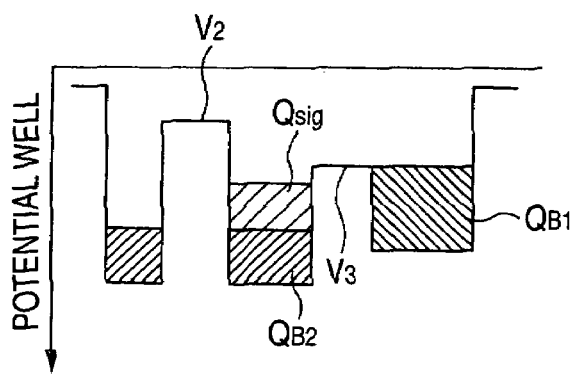

When a voltage is applied to the gate electrode 145r of the color selection transistor 118r so that a red signal is selected, the level of a potential barrier formed by the gate electrode 145r is reduced from V1 to V3 so that the signal charges Qsig are transferred to a potential well of the drain 141 of the transistor 118r, as shown in FIG. 6C. A signal in accordance with the signal charges Qsig is output from the source of the output transistor 115 to the column signal line (image signal readout line) 110.

Charges QB2 retaining in the drain 141 are constant bias charges retaining in the gate electrode of the output transistor 115 and the portion electrically connected to the gate electrode of the output transistor 115.

Figure 6D:
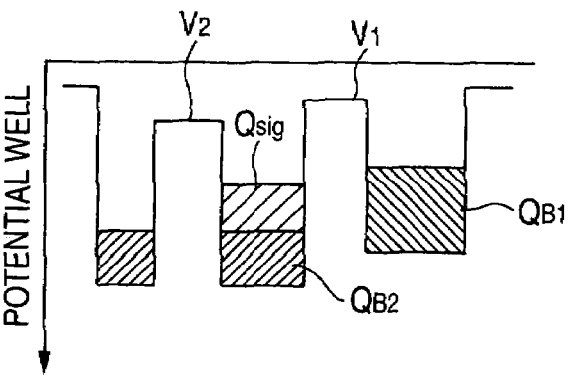

When selection of the red signal is off, the level of the potential barrier formed by the gate electrode 145r returns from V3 to V1 as shown in FIG. 6D.

Next, when a green signal is output to the column signal line 110, the red signal charges Qsig retaining in the gate electrode portion of the output transistor 115 are drained. This is performed by applying a reset signal to the gate electrode 141 of the reset transistor 117. When the reset signal is applied, the level of the potential barrier V2 is reduced so that the red signal charges Qsig retaining in the gate electrode portion of the output transistor 115 are drained to the DC power supply line 114, and then the reset signal is turned off.

Next, a green selection signal is applied to the gate electrode of the color selection transistor 118g, signal charges flowing from the green pixel electrode film 120g into the connection portion 119g are transferred to the gate electrode of the output transistor 115 so that a signal in accordance with the amount of green signal charges is output to the column signal line 110.

Then, the green signal charges are drained by use of the reset transistor 117 in the same manner as described above. A blue selection signal is applied to the color selection transistor 118b so that a signal in accordance with the amount of blue signal charges is output to the column signal line 110.

In this manner, in the embodiment, color signals of the three colors of red (R), green (G) and blue (B) detected by one photo acceptance portion are selected successively by use of three color selection transistors 118r, 118g and 118b and three transistors constituting the charge detection cell 109, that is, by use of six transistors in total so that the signals are output color by color. Accordingly, the number of transistors provided in one photo acceptance portion can be reduced and the number of column signal lines can be reduced so that manufacturing becomes easy. When an analog-to-digital conversion portion is provided in the image signal output portion 103, it may be sufficient if one analog-to-digital conversion portion is provided.

Although the number of wirings connected to the row selection scanning circuit 102 is increased because the color selection signal lines 113r, 113g, and 113b are provided in accordance with colors, the wirings can be formed in a metal wiring manner to make manufacturing easy.

Second Embodiment

In the first embodiment, the following disadvantage may occur. To capture a still image, a mechanical shutter has to be used. If an image signal is output after the mechanical shutter is closed after the image capturing, no problem will be caused. A problem will be, however, caused when the mechanical shutter cannot be used, for example, when a motion picture is captured.

In the state where signal charges in a certain color pixel become excessive because of a very bright subject, the excessive charges flow into a gate of an output transistor through a color selection transistor. Because the excessive charges are added to any other color signal, color mixture may occur to thereby result in deterioration in image quality.

Such excessive charges may also occur just after resetting. A signal just after resetting is a reference signal in a zero signal state. The level of the reference signal becomes large. For this reason, there occurs a phenomenon that the level of a saturated output signal is reduced by the excess of charges flowing into the reference signal. When an image of a very bright spherical electric bulb is captured, it will become an unnatural image because a very bright center portion of the image becomes black.

The second embodiment aims at avoiding deterioration in image quality such as color mixture and lowering of the saturated output as described above. In the second embodiment, the structure is totally the same as that in the first embodiment, except that the DC voltage applied to each of the common electrode films is different. In the first embodiment, the voltage applied to each of the common electrode films 122r, 122g and 122b is set to be a ground potential. On the other hand, in the second embodiment, the voltage is set to be higher than the potential V1 shown in FIG. 6B.

When excessive charges are generated thus, an electric field becomes zero or reversed so that the excessive charges which would otherwise result in the potential not higher than V1 are not accumulated in each color pixel. Accordingly, the inflow of the excessive charges does not occur.

Third Embodiment

Figure 7:
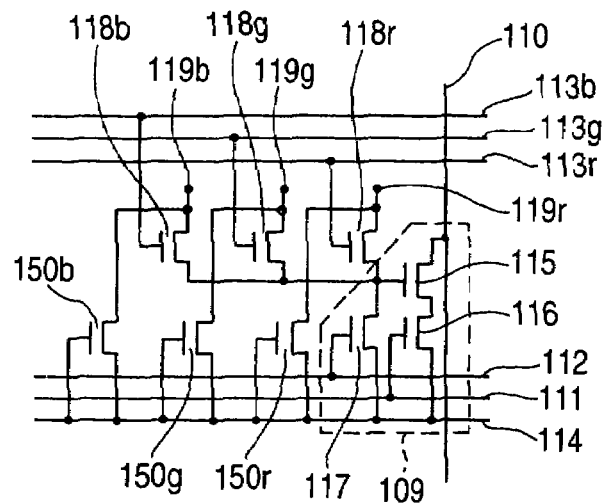
FIG. 7 is a circuit diagram of a signal readout circuit of a solid-state imaging device according to a third embodiment of the invention.

FIG. 7 is a circuit configuration diagram of each signal readout circuit according to a third embodiment of the invention. This embodiment has the same fundamental circuit configuration as that of FIG. 4 used in the first or second embodiment, but is different from the first or second embodiment in that charge drain transistors 150r, 150g and 150b are added.

A source of the charge drain transistor 150r is connected to the connection portion 119r. A gate and a drain of the charge drain transistor 150r are connected to the DC power supply line 114. The same rule applies to the charge drain transistors 150g and 150b. Sources of the charge drain transistors 150g and 150b are connected to the connection portions 119g and 119b respectively. Gates and drains of the charge drain transistors 150g and 150b are connected to the DC power supply line 114.

The film thickness of the gate electrode of each of the charge drain transistors 150r, 150g and 150b and the impurity distribution of the surface of the semiconductor substrate under the gate electrode are selected so that the level of a potential well of the gate electrode is higher than the potential V1 in FIG. 6B.

According to this configuration, excessive charges generated in each color pixel are drained to the DC power supply line 114 through a channel under corresponding one of the gate electrodes of the charge drain transistors 150r, 150g and 150b because the level of the potential barrier to the signal charges under the corresponding one of the gate electrodes of the charge drain transistors 150r, 150g and 150b is low.

Although this embodiment has been described on the case where the number of transistors is increased by three, phenomena of color mixture and lowering of the saturated output can be avoided in the same manner as in the second embodiment, because an electric field for sweeping out excessive charges is always present in each color pixel portion.

Fourth Embodiment

Figure 8:
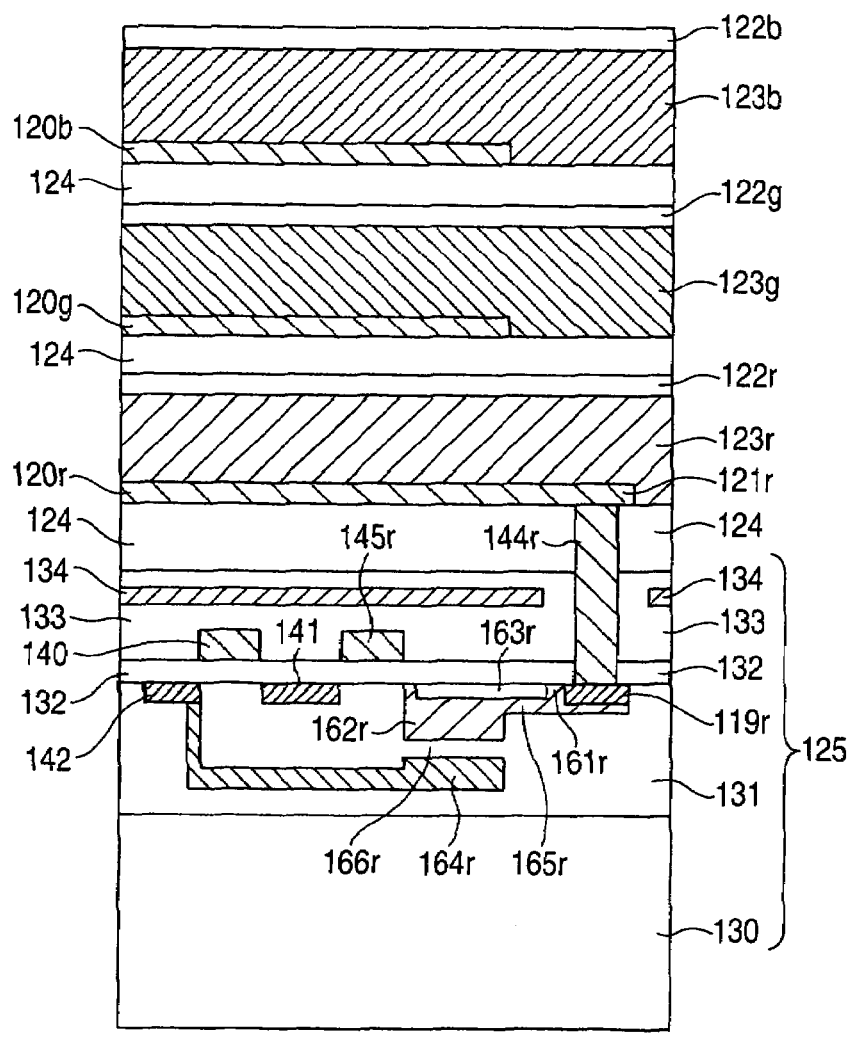
FIG. 8 is a typical sectional view of main part of a solid-state imaging device according to a fourth embodiment of the invention.

FIG. 8 is a typical sectional view of main part according to a fourth embodiment of the invention. FIG. 8 corresponds to FIG. 5 in the first embodiment. In this embodiment, the semiconductor substrate 125 includes a first semiconductor layer having a first conductivity type opposite to a conductivity type of a semiconductor region of the connection portion; a second semiconductor layer having a second conductivity type common to the conductivity type of the semiconductor region of the connection portion; and a third semiconductor layer having the first conductivity type in this order, as a potential barrier unit and a charge-storage unit. Further the semiconductor substrate 125 includes a fourth semiconductor layer having the second conductivity type in the third semiconductor layer and on a lower side of the charge-storage unit, as a charge overflow drain. More specifically, in this embodiment, a thin low-density n-type impurity region (the second semiconductor layer) 161r is formed in a surface portion of a P-well layer (the third semiconductor layer) 131 so as to be continued to a connection portion 119r made of a high-density n-type impurity region (n+ region). Successively, a thick high-density n-type impurity region 162r is formed to extend to a position just below a gate electrode 145r. A high-density p-type impurity region (the first semiconductor layer) 163r is formed on surface portions of the regions 161r and 162r. The region 163r is provided in a position neither overlapping the gate electrode 145r nor in contact with the connection portion 119r.

An n-type semiconductor layer (the fourth semiconductor layer) 164r is formed below the thick high-density n-type impurity region 162r by ion implantation or the like so as to be separated from the region 162r. The n-type semiconductor layer 164r is connected to a drain 142 of a reset transistor 117 by an n-layer region.

The n-type semiconductor region 164r serves as an overflow drain and is electrically connected to the DC power supply line 114 through the drain of the reset transistor 117.

A region 165r where the thin n-type semiconductor region 161r and the high-density p-type impurity region 163r overlap each other serves as a potential barrier portion. The thicknesses and impurity densities of the p-type semiconductor region 163r, the n-type semiconductor region 161r and the P-well layer 131 are selected so that the level of a potential well V4 of the potential barrier region 165r approaches the level of the potential well V1 in FIG. 6B. The thick n-type semiconductor region 162r severs as a charge-storage portion. That is, in this embodiment, the potential barrier portion is between the connection portion 119r and the charge-storage portion, and an end portion of the charge-storage portion overlaps the color selection transistor 118r (an end portion the gate electrode 145r of the color selection transistor 118r).

A region 166r between the thick n-type semiconductor region 162r and the n-type semiconductor region 164r formed below the thick n-type semiconductor region 162r is a partial region of the P-well layer 131 near to the overflow drain 164r. Excessive charges in the n-type semiconductor region 162r pass through the depleted partial region 166r and are drained to the n-type semiconductor layer (overflow drain) 164r.

The thicknesses and impurity densities of the p-type semiconductor region 163r, the n-type semiconductor region 162r, the partial region 166r of the P-well layer 131 and the overflow drain 164r are selected so that the level of the potential barrier of the partial region 166r is higher than the potential V1 in FIG. 6B.

Figure 9A:
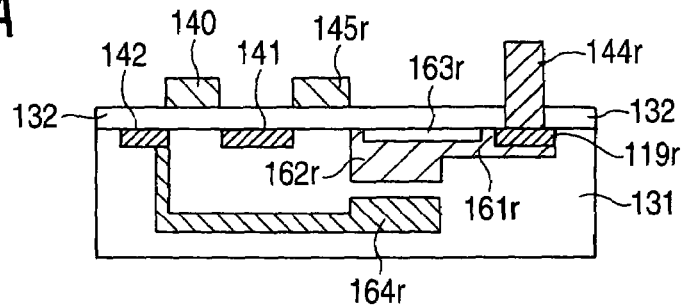
FIGS. 9A to 9D are views for explaining transfer of the charges in the solid-state imaging device according to the fourth embodiment of the invention.
Figure 9B:
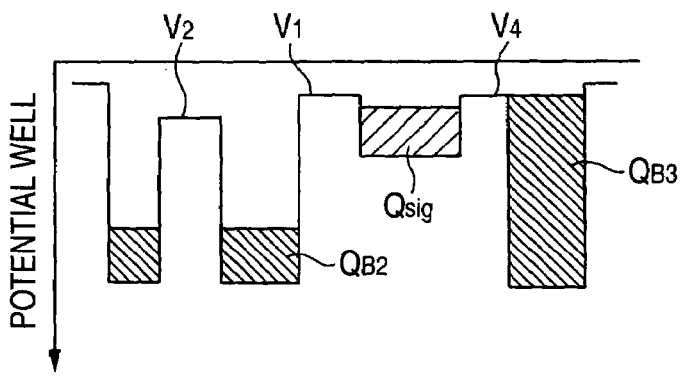
Figure 9C:
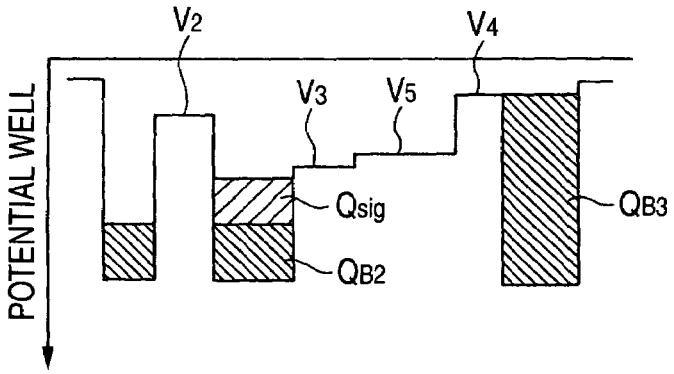
Figure 9D:
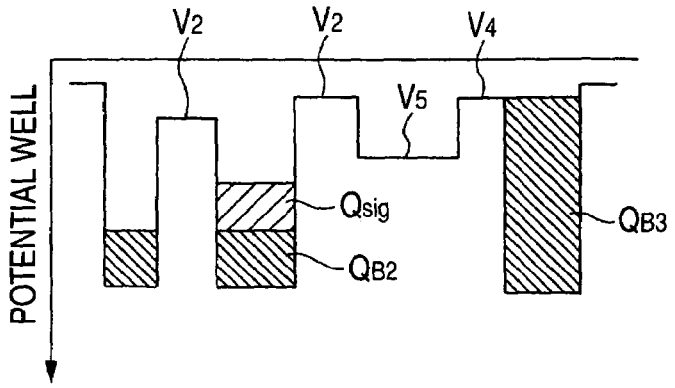

FIGS. 9A to 9D are views for explaining transfer of charges in the structure shown in FIG. 8. FIG. 9A is a view of the structure of main part extracted from FIG. 8. FIG. 9B is a view showing the state of a potential well just after resetting in the structure of FIG. 9A. FIG. 9C is a view showing the potential well when a color selection signal for a red pixel is applied to a gate electrode of a color selection transistor 118r. FIG. 9D is a view showing the potential well just after the color selection signal for the red pixel is off.

In FIGS. 9A to 9D, the symbol V4 designates a potential well of a potential barrier region 165r; V5, a potential well in the state where signal charges Qsig are not present in an n-type semiconductor region 162r; and QB3, constant bias charges retaining in a connection portion 119r.

Signal charges flowing from a red pixel electrode film 120r into the connection 119r are not accumulated in a potential well formed in the connection portion 119r, but go across the potential V4 of the potential barrier region 165r and are accumulated in the n-type semiconductor region 162r. When excessive charges flow into the n-type semiconductor region 162r, the excess of charges is drained to the overflow drain 164r. Accordingly, in this embodiment, deterioration in image quality such as color mixture and lowering in the saturated output can be prevented.

Because signal charges are not accumulated in the color pixel portion but accumulated in the n-type semiconductor region 162r, there is an advantage that the signal charges can be transferred to a gate portion of an output transistor rapidly so that an after-image phenomenon can be reduced.

In the state of FIG. 6C as described above, when variation in bias charges due to fluctuation in the voltage of the color selection signal or superposition of noise is added as noise to the signal charges, S/N is lowered. In the embodiment, however, there is an advantage that fluctuation in the voltage of the color selection signal or superposition of noise will not cause lowering of S/N because there is no charge remaining in the potential well in the charge-storage region as shown in FIG. 9C.

Fifth Embodiment

Figure 10:
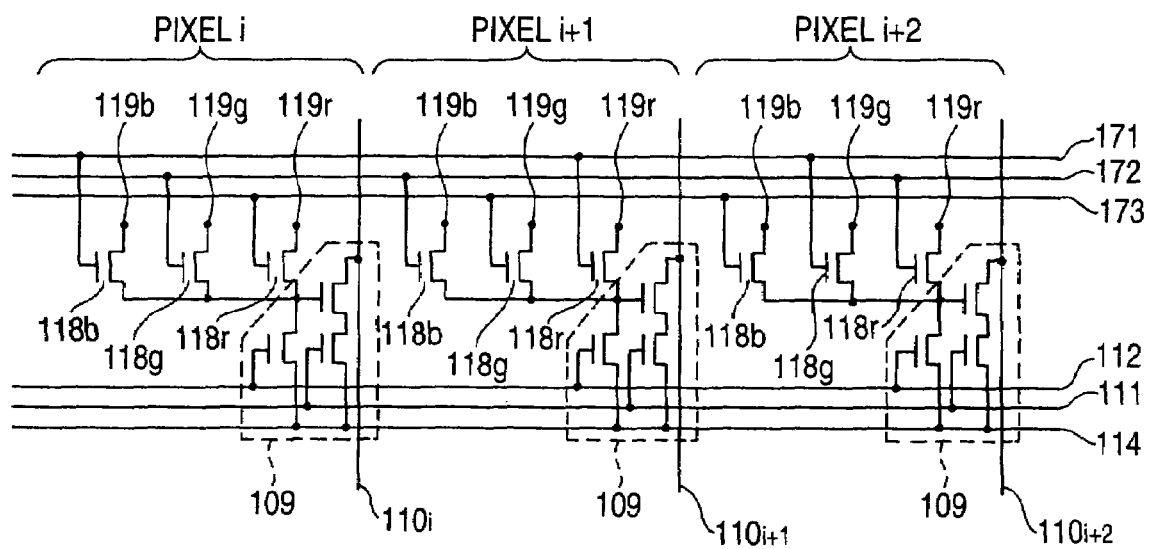
FIG. 10 is a circuit view of signal readout circuits for reading out signals from three pixels arranged horizontally in a solid-state imaging device according to a fifth embodiment of the invention.

FIG. 10 is a circuit diagram of horizontal three pixels' signal readout circuits according to a fifth embodiment of the invention. In each of the first to fourth embodiments, the signal readout circuit in each pixel has the same configuration. That is, color selection transistors in accordance with the pixels horizontally arranged (i.e. the pixels arranged in a row direction) connect to a selection signal line (a color selection signal line) so that the pixels horizontally arranged simultaneously read out signals having common color.

In this embodiment, however, the positions of connection of gate electrodes of color selection transistors 118r, 118g and 118b constituting signal readout circuits for pixels adjacent horizontally to one another are changed cyclically. That is, color selection transistors in accordance with the pixels horizontally arranged connect to a selection signal line so that adjacent two of the pixels horizontally arranged simultaneously read out signals having different colors.

More specially, a first group selection signal line 171, a second group selection signal line 172 and a third group selection signal line 173 are provided in place of the color selection signal lines 113r, 113g and 113b in FIG. 1. When gates of color selection transistors 118r, 118g and 118b for a pixel i are connected to the signal lines 173, 172 and 171 respectively in this order, gates of color selection transistors 118r, 118g and 118b for a pixel i+1 horizontally adjacent to the pixel i are connected to the signal lines 171, 173 and 172 respectively in this order, gates of color selection transistors 118r, 118g and 118b for a pixel i+2 horizontally adjacent to the pixel i+1 are connected to the signal lines 172, 171 and 173 respectively in this order, and gates of color selection transistors 118r, 118g and 118b for a pixel i+3 horizontally adjacent to the pixel i+2 are connected in the same order as that for the pixel i.

In the first embodiment, that is, in the case where all the color selection signal lines 113r, 113g and 113b of the color selection transistors 118r, 118g and 118b for respective pixels are connected in the same order, when a selection signal of the color selection signal line 113r in a certain row is turned on, red signals are output from all pixels in the row to the column signal lines 110 respectively. Although there is no problem if a high-resolution color image is generated from color signals of all pixels, the signal readout time however becomes long when a low-resolution color motion picture is generated at a high frame rate because signals of the three colors of red (R), green (G) and blue (B) cannot be obtained unless readout is performed three times each row even if the color motion picture is thinned in a vertical direction (column direction).

On the other hand, when, for example, an on signal is applied to the first group selection signal line 171 in the connection configuration shown in FIG. 10, a blue (B) signal is output from the pixel i to a column signal line 100i, a red (R) signal is output from the pixel i+1 to a column signal line 100i+1, and a green (G) signal is output from the pixel i+2 to a column signal line 100i+2.

Accordingly, when, for example, a readout operation is performed only for the first group selection signal line 171 in the case where a low-resolution color motion picture is to be generated at a high frame rate, the readout time based on the readout operation is almost ⅓ as long as the readout time for reading out all the pixels. When reading is made from only odd-number rows of pixels, the readout time becomes ⅙. In addition, because signals of three colors detected simultaneously by respective color pixels can be read out simultaneously from the three pixels adjacent to one another, the high frame rate color motion picture generated from these signals can be prevented from being unnatural in color.

As described above, in the photoelectric conversion film lamination type solid-state imaging device according to each of the embodiments, signal charges for a (three colors') pixel located in one and the same pixel position are detected by a common output transistor, a common reset transistor and a common row selection transistor. Accordingly, the number of transistors required for each pixel can be reduced (the number of transistors is six in each of the first, second, fourth, and fifth embodiments, and the number of transistors is nine in the third embodiment). Moreover, the number of column signal lines for reading out image signals can be reduced to one. Accordingly, it is easy to make each pixel finer.

In addition, it is possible to suppress deterioration in image quality such as a color mixture phenomenon or lowering of the saturated output caused by sharing of a charge detection cell among a plurality of pixels (i.e. three colors' pixel). Thus, it is possible to obtain a good image signal.

Although the respective embodiments have been described on the case where the signal readout circuit has such a circuit configuration that a power supply line, a row selection transistor, an output transistor and a column signal line are connected in this order, the invention may be applied to the case where the signal readout circuit has such a circuit configuration that a power supply line, an output transistor, a row selection transistor and a column signal line are connected in this order.

Although the respective embodiments have been described on the case where the photoelectric conversion films are provided as three layers so that incident light is detected while the color of the incident light is separated into the three primary colors of R, G and B, the invention may be applied to the case where a fourth photoelectric conversion film for detecting an intermediate color between green and blue besides R, G and B is additionally provided so that incident light is detected while the color of the incident light is separated into four colors. In this case, only one color selection transistor needs to be additionally provided per pixel. Accordingly, color reproducibility can be improved because color separation can be made more finely.

Although the embodiments have been described on the case where the photoelectric conversion films for detecting blue, green and red incident light components are provided in increasing order of wavelength viewed from above the solid-state imaging device, the arrangement sequence of photoelectric conversion films is not limited thereto. Although a common electrode film and a corresponding pixel electrode film are provided so that each photoelectric conversion film is sandwiched between the common electrode film and the corresponding pixel electrode film, the common electrode film need not be provided on the upper side of the photoelectric conversion film, that is, the common electrode film may be provided on the lower side of the photoelectric conversion film.

Although each of all the pixel electrode films and common electrode films is made of a transparent or low-light-absorption material, only the electrode film nearest to the semiconductor substrate may be made of an opaque material.

Although the description of the respective embodiments has not touched on the subject about an electron shutter, it is a matter of course that the same electron shutter function as that of a general CMOS type image sensor can be given to the invention.

The photoelectric conversion film lamination type solid-state imaging device according to the invention has an advantage that the device can be used in place of a CCD type or CMOS type image sensor used heretofore, and that signals of the three colors of red, green and blue can be obtained from one pixel without use of any color filter. Accordingly, the photoelectric conversion film lamination type solid-state imaging device according to the invention is useful when mounted in a digital camera, etc.

It will be apparent to those skilled in the art that various modifications and variations can be made to the described preferred embodiments of the present invention without departing from the spirit or scope of the invention. Thus, it is intended that the present invention cover all modifications and variations of this invention consistent with the scope of the appended claims and their equivalents.

The present application claims foreign priority based on Japanese Patent Application No. JP2004-77756, filed Mar. 18 of 2004, the contents of which is incorporated herein by reference.

What is claimed is:

1. A solid-state imaging device comprising:
a semiconductor substrate;
a plurality of photoelectric conversion films stacked in a direction perpendicular to a surface of the semiconductor substrate, the photoelectric conversion films detecting different colors contained in an incident light; and
a plurality of pixel electrode films on each of the photoelectric conversion films, the pixel electrode films being partitioned in accordance with pixels,
wherein
the semiconductor substrate includes:
a plurality of color selection transistors corresponding to one of the pixels, wherein the color selection transistors each corresponds to one of the photoelectric conversion films and connects to one of the pixel electrode films on the one of the photoelectric conversion films so as to be capable of selecting the one of the photoelectric conversion films; and
a charge detection cell corresponding to one of the pixels, wherein the charge detection cell is common to the photoelectric conversion films, and the charge detection cell reads out an image signal to an image signal readout line in accordance with a signal charge generated in each of the photoelectric conversion films.

2. The solid-state imaging device according to claim 1, wherein the semiconductor substrate includes a charge drain transistor corresponding to one of the color selection transistors, and the charge drain transistor drains the signal charge to a power supply line,
wherein the signal charge is generated by one of the photoelectric conversion films, the one of the photoelectric conversion films has one of the pixel electrode films thereon, and the one of the pixel electrode films connects to the one of the color selection transistors.

3. The solid-state imaging device according to claim 1, wherein the semiconductor substrate includes: a connection portion that connects one of the pixel electrode films to the surface of the semiconductor substrate by a wiring; a potential barrier unit near to the connection portion; and a charge-storage unit near to the potential barrier unit, the charge-storage unit connecting to one of the color selection transistors.

4. The solid-state imaging device according to claim 3, wherein the semiconductor substrate includes: a first semiconductor layer having a first conductivity type opposite to a conductivity type of a semiconductor region of the connection portion; a second semiconductor layer having a second conductivity type common to the conductivity type of the semiconductor region of the connection portion; and a third semiconductor layer having the first conductivity type in this order, and
the potential barrier unit and the charge-storage unit comprise the first, second and third semiconductor layers.

5. The solid-state imaging device according to claim 4, wherein the first semiconductor layer has a first thickness and a first impurity density, the second semiconductor layer has a second thickness and a second impurity density, and the third semiconductor layer has a third thickness and a third impurity density, so that the potential barrier unit serves as a potential barrier and the charge-storage unit accumulates the signal charge.

6. The solid-state imaging device according to claim 4, wherein the semiconductor substrate further includes a fourth semiconductor layer in the third semiconductor layer and on a lower side of the charge-storage unit, the fourth semiconductor layer has the second conductivity type, and the fourth semiconductor layer is a charge overflow drain.

7. The solid-state imaging device according to claim 6, wherein the third semiconductor layer has a third thickness and a third impurity density, and the fourth semiconductor layer has a fourth thickness and a fourth impurity density so that an excessive charge in the charge-storage unit is drained to the charge overflow drain.

8. The solid-state imaging device according to claim 1, wherein the pixels are arranged in a tetragonal lattice, and color selection transistors in accordance with the pixels horizontally arranged connect to a selection signal line so that the pixels horizontally arranged simultaneously read out signals having common color.

9. The solid-state imaging device according to claim 1, wherein the pixels are arranged in a tetragonal lattice, and color selection transistors in accordance with the pixels horizontally arranged connect to a selection signal line so that adjacent two of the pixels horizontally arranged simultaneously read out signals having different colors.

10. The solid-state imaging device according to claim 1, wherein the photoelectric conversion films include: a first photoelectric conversion film having a peak of spectral sensitivity characteristic at red; a second photoelectric conversion film having a peak of spectral sensitivity characteristic at green; and a third photoelectric conversion film having a peak of spectral sensitivity characteristic at blue.

11. The solid-state imaging device according to claim 1, wherein the semiconductor substrate includes an image signal output portion that accepts a analog signal of the image signal and outputs the analog signal, the analog signal being read out from the charge detection cell to the image signal readout line.

12. The solid-state imaging device according to claim 1, wherein the image signal output portion comprises an analog-to-digital conversion portion that converts the analog signal to a digital signal and outputs the digital signals.

13. The solid-state imaging device according to claim 1, wherein the charge detection cells comprises: an output transistor that outputs the image signal to the image signal readout line in accordance with the signal charge; a selection transistor that switches between an operation and non-operation of the output transistor; and a reset transistor that drains the signal charge retaining in the output transistor.

* * * * *